(12) United States Patent
Sundblad

(10) Patent No.: US 9,331,708 B2
(45) Date of Patent: May 3, 2016

(54) ESTIMATION OF IMPERFECTIONS OF A TIME-INTERLEAVED ANALOG-TO-DIGITAL CONVERTER

(71) Applicant: Anacatum Design AB, Linköping (SE)

(72) Inventor: Rolf Sundblad, Ljungsbro (SE)

(73) Assignee: ANACATUM DESIGN AB, Linköping (SE)

( * ) Notice: Subject to any disclaimer, the term of this patent is extended or adjusted under 35 U.S.C. 154(b) by 0 days.

(21) Appl. No.: 14/769,914

(22) PCT Filed: Mar. 7, 2014

(86) PCT No.: PCT/EP2014/054467
§ 371 (c)(1),
(2) Date: Aug. 24, 2015

(87) PCT Pub. No.: WO2014/135685
PCT Pub. Date: Sep. 12, 2014

(65) Prior Publication Data
US 2016/0006447 A1  Jan. 7, 2016

Related U.S. Application Data

(60) Provisional application No. 61/774,967, filed on Mar. 8, 2013.

(51) Int. Cl.
H03M 1/36 (2006.01)
H03M 1/10 (2006.01)
H03M 1/12 (2006.01)

(52) U.S. Cl.
CPC .......... *H03M 1/1004* (2013.01); *H03M 1/1057* (2013.01); *H03M 1/121* (2013.01); *H03M 1/1245* (2013.01); *H03M 1/1215* (2013.01)

(58) Field of Classification Search
CPC ... H03M 1/50; H03M 1/1004; H03M 1/1215; H03M 1/1019; H03M 1/1255; H03M 1/1245; H03M 1/121; H03M 1/1057
USPC ................................................. 341/118–166
See application file for complete search history.

(56) References Cited

U.S. PATENT DOCUMENTS 7,292,170 B2  11/2007  Kinyua et al.
7,961,123 B2  6/2011  Nagarajan et al.
(Continued)

FOREIGN PATENT DOCUMENTS

EP  0624289 B1  9/1997
JP  H0645936 A  2/1994
(Continued)

OTHER PUBLICATIONS

PCT International Preliminary Report on Patentability dated Feb. 18, 2015 for PCT International Application No. PCT/EP2014/054467, 6 pages.
(Continued)

*Primary Examiner* — Lam T Mai
(74) *Attorney, Agent, or Firm* — Remarck Law Group PLC

(57) ABSTRACT

A method of operating a time-interleaved analog-to-digital converter for conversion of an analog input signal to a digital output signal having a sample rate R comprises, for each of at least some activations of an array of constituent analog-to-digital converters, defining first and second sets of the constituent analog-to-digital converters, feeding the analog input of each analog-to-digital converter of the first set with a reference value for imperfection measurements and clocking each analog-to-digital converter of the first set with one of the timing signals, feeding the analog input of each of analog-to-digital converter of the second set with the analog input signal for generation of an intermediate constituent digital output signal at the digital output and clocking each analog-to-digital converter of the second set with one of the timing signals, wherein no timing signal is used to clock two or more of analog-to-digital converters of the second set.

15 Claims, 6 Drawing Sheets

(56) References Cited

U.S. PATENT DOCUMENTS

| | | | |
|---|---|---|---|
| 8,310,387 B2 | 11/2012 | Harris et al. | |
| 8,487,795 B1 | 7/2013 | Jiang et al. | |
| 8,611,483 B2 | 12/2013 | Zhu et al. | |
| 8,643,428 B2 | 2/2014 | Dedic et al. | |
| 9,000,962 B1* | 4/2015 | Leuciuc | H03M 1/1033 341/120 |
| 2008/0158029 A1* | 7/2008 | Xu | H03M 1/0626 341/120 |
| 2010/0013692 A1* | 1/2010 | Yamamoto | H03M 1/1245 341/158 |
| 2010/0277354 A1 | 11/2010 | Lee et al. | |
| 2011/0128175 A1 | 6/2011 | Harris et al. | |
| 2011/0234435 A1* | 9/2011 | Woodward | H03M 1/124 341/137 |
| 2011/0304489 A1* | 12/2011 | Christer | H03M 1/1019 341/118 |
| 2014/0152477 A1* | 6/2014 | Lewis | H03M 1/1061 341/122 |
| 2014/0152478 A1* | 6/2014 | Lewis | H03M 1/0673 341/123 |
| 2015/0381195 A1* | 12/2015 | Sundblad | H03M 1/1255 341/123 |
| 2016/0020777 A1* | 1/2016 | Sundblad | H03M 1/004 341/141 |

FOREIGN PATENT DOCUMENTS

| | | |
|---|---|---|
| JP | 2011049746 A | 3/2011 |
| WO | 0044099 A1 | 7/2000 |
| WO | 2007093478 A1 | 8/2007 |
| WO | 2010042051 A1 | 4/2010 |
| WO | 2012123578 A1 | 9/2012 |

OTHER PUBLICATIONS

PCT International Preliminary Report on Patentability dated Feb. 9, 2015 for PCT International Application No. PCT/EP2014/054469, 6 pages.

PCT International Search Report dated Aug. 14, 2014 for PCT International Application No. PCT/EP2014/054470, 1 page.

PCT International Search Report dated May 28, 2014 for PCT International Application No. PCT/EP2014/054469, 2 pages.

Van Thillo, W. et al., "A Flexible Antenna Selection Scheme for 60 GHz Multi-Antenna Systems Using Interleaved ADCs," IEEE Communications Society, IEEE ICC 2009 Proceedings, Jun. 14, 2009, 5 pages.

U.S. Appl. No. 14/771,835, filed Sep. 1, 2015, Sundblad.
U.S. Appl. No. 14/769,945, filed Aug. 24, 2015, Sundblad.

\* cited by examiner

ESTIMATION OF IMPERFECTIONS OF A TIME-INTERLEAVED ANALOG-TO-DIGITAL CONVERTER

CROSS-REFERENCE TO RELATED APPLICATIONS

This application is a 371 U.S. National Stage of International Application No. PCT/EP2014/054467, filed Mar. 7, 2014, which claims priority to U.S. Provisional Application No. 61/774,967, filed Mar. 8, 2013. The disclosure of each of the above applications is incorporated herein by reference in their entirety.

TECHNICAL FIELD

The present invention relates generally to the field of analog-to-digital converters. More particularly, it relates to estimation of imperfections of a time-interleaved analog-to-digital converter.

BACKGROUND

Electronic equipment (such as, for example, television sets and other audio/video equipments) are commonly implemented using digital technology instead of analog technology. Typically, the more advanced the digital technology gets the more demanding the task of converting an analog signal to a digital signal suitable for the digital technology implementation becomes.

Conceptually, an analog-to-digital converter (also denoted ADC or A/D converter) is very well know in the art as well as its basic functionality (sample-and-hold, quantization) and will not be elaborated on further herein.

For high sampling frequencies it may be necessary or at least beneficial to use ADC structures comprising several constituent ADC:s to be able to accommodate the high sampling frequency. Such structures alleviate the processing speed requirements on each constituent ADC. Examples of such ADC structures are pipe-lined ADC:s and time-interleaved ADC:s (e.g. parallel successive ADC:s). US 2011/0304489 A1, WO 2007/093478 A1, EP 0624289 B1 and WO 2010/042051 A1 describe various example time-interleaved ADC structures.

All electronic equipment has inherent imperfections, which may be more or less prominent. This is, of course, also the case for ADC:s, and in particular for each constituent ADC of a time-interleaved ADC. It may be desirable to estimate the imperfections to be able to compensate for them. For example, compensation may be applied in the digital domain, in the analog domain, or both in the digital and analog domain.

A drawback of the known techniques for imperfection estimation is that they cannot be performed during the conversion of any analog signal. It is required to either have a separate estimation session (e.g. in connection to the production of the ADC) or to rely on a known signal part being incorporated in the analog signal (see e.g. US 2011/0304489 A1 where estimation of offset errors rely on a known signal level which is repeatedly present in the analog signal). Thus, if an analog signal with no known signal part is to be converted and there are imperfections that change dynamically over time, it would be cumbersome to provide compensation for those imperfections.

Therefore, there is a need for alternative and improved methods and arrangements for estimation of imperfections of a time-interleaved analog-to-digital converter.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide methods and arrangements for estimation of imperfections of a time-interleaved analog-to-digital converter.

According to a first aspect, this is achieved by a method of operating a time-interleaved analog-to-digital converter for conversion of an analog input signal to a digital output signal having a sample rate R.

The time-interleaved analog-to-digital converter comprises a timing circuit for generating a number M of timing signals, and an array of an integer number N of constituent analog-to-digital converters each having an analog input and a digital output.

The method comprises, for each of at least some activations of the array of constituent analog-to-digital converters, defining a first set of an integer number K of the constituent analog-to-digital converters and a second set of an integer number L of the constituent analog-to-digital converters, wherein K+L=N, K is at least one and less than N and the first and second sets are non-overlapping.

The method also comprises, for each of the at least some activations of the array of constituent analog-to-digital converters, feeding the analog input of each of the constituent analog-to-digital converters of the first set with a reference value for imperfection measurements and clocking each of the constituent analog-to-digital converters of the first set with one of the timing signals.

Furthermore, the method comprises, for each of the at least some activations of the array of constituent analog-to-digital converters, feeding the analog input of each of the constituent analog-to-digital converters of the second set with the analog input signal for generation of an intermediate constituent digital output signal at the digital output and clocking each of the constituent analog-to-digital converters of the second set with one of the timing signals, wherein no timing signal is used to clock two or more of the constituent analog-to-digital converters of the second set.

According to some embodiments, each timing signal may be a time-shifted copy of a clock signal having a clock signal period P. In some embodiments, one of the timing signals may be a time-shifted copy of the clock signal wherein the time shift is zero.

According to some embodiments, the steps performed for each of at least some activations of the array of constituent analog-to-digital converters may be performed for each activation of the array of constituent analog-to-digital converters.

An activation of the array of constituent analog-to-digital converters may refer to a number of events during a period of time when each of the constituent analog-to-digital converters of the array is activated exactly once. In some embodiments, an activation of the array of constituent analog-to-digital converters may refer to a number of events during a period of time when each currently used constituent analog-to-digital converter of the array is activated exactly once (e.g. when one or more of the constituent analog-to-digital converters of the array is in an off mode or sleep mode, for example for energy efficiency reasons). That a constituent analog-to-digital converter is activated may refer to that an analog sample value (from an analog input signal or a reference signal) is input and processed by the constituent analog-to-digital converter.

In some embodiments, the reference value may be a zero value and may be achieved by a connection to ground. In other embodiments, the reference value may be a non-zero value. In yet other embodiments, the reference value may vary among two or more values (one of which may be zero) so that different types of imperfection measurements may be performed.

In a typical embodiment, K may be equal to 1.

If, according to some embodiments, the array of constituent analog-to-digital converters is activated exactly once per clock signal period P, then M may be equal to L. In such embodiments, each constituent analog-to-digital converter may have a processing speed that enables it to output a digital sample value once every clock signal period P. Such embodiments may be viewed on as having K redundant constituent analog-to-digital converters.

If, according to some other embodiments, no redundant constituent analog-to-digital converters should be present, then M may be equal to N and the array of constituent analog-to-digital converters has to be activated more often than once per clock signal period P. Thus, in such embodiments, each constituent analog-to-digital converter may have a processing speed that enables it to output a digital sample value more often than once every clock signal period P. Typically, each constituent analog-to-digital converter may have a processing speed that enables it to output a digital sample value once every period of P–K/R in these embodiments.

In some embodiments, clocking each of the constituent analog-to-digital converters of the first set with one of the timing signals typically comprises clocking a constituent analog-to-digital converter with a timing signal that is as close as possible to being halfway between a timing signal used to clock the constituent analog-to-digital converter during a previous activation of the array and a timing signal used to clock the constituent analog-to-digital converter during a subsequent activation of the array.

In some embodiments, clocking each of the constituent analog-to-digital converters of the second set with one of the timing signals comprises clocking the constituent analog-to-digital converters of the second set in a sequential fashion in relation to their physical location in an implementation. In some embodiments, clocking each of the constituent analog-to-digital converters of the second set may comprise clocking a constituent analog-to-digital converter with a timing signal that is as close as possible to being halfway between a timing signal used to clock the constituent analog-to-digital converter during a previous activation of the array and a timing signal used to clock the constituent analog-to-digital converter during a subsequent activation of the array. In other embodiments, other clocking rules may be applied (see, for example, WO 2007/093478 A1 for a pseudo-random clocking scheme). Generally, the constituent analog-to-digital converters of the second set may be clocked according to any suitable rule as long as no timing signal is used to clock two or more of the constituent analog-to-digital converters of the second set during each of the at least some activations of the array.

According to some embodiments the method may further comprise, for each of the at least some activations of the array of constituent analog-to-digital converters, selecting the K constituent analog-to-digital converters of the first set among the L constituent analog-to-digital converters of the second set of a previous activation. For example, the selection may be conditioned by that, during any N/K activations, all N constituent analog-to-digital converters of the array are to belong to the first set at least once. Application of such embodiments ensures that all constituent analog-to-digital converters are given the same number of opportunities to estimate imperfections. In a typical implementation the membership of the first set may circulate among the constituent analog-to-digital converters in a round-robin fashion or according to any other uniform distribution rule. It should be noted, though, that in some embodiments it may be beneficial to measure imperfections non-uniformly among the constituent analog-to-digital converters and, thus, other methods for selection of the K constituent analog-to-digital converters of the first set may be applied.

The method may, according to some embodiments, further comprise, for each of the constituent analog-to-digital converters of the second set, compensating the intermediate constituent digital output signal based on previous imperfection measurements of the constituent analog-to-digital converter. Thus, the imperfection measurements of each constituent analog-to-digital converter are used to compensate one or more subsequent digitized signals of the constituent analog-to-digital converter. This may, for example, be achieved by storing the imperfection measurements in a memory or register for later use, or by adjusting compensation parameters for later use based on the imperfection measurements. In some embodiments, the method also comprises, for each of the constituent analog-to-digital converters of the second set, compensating the intermediate constituent digital output signal based on previous imperfection measurements of one or more other ones of the constituent analog-to-digital converters. For example, an average imperfection value among the constituent analog-to-digital converters may be calculated and used for compensation. Compensation may comprise correction or at least an improvement of the imperfection situation.

In some embodiments, the method may further comprise multiplexing the compensated intermediate constituent digital output signals of the constituent analog-to-digital converters of the second set to produce the digital output signal. The multiplexing may comprise sequencing. Typically, the multiplexing may be related to the clocking of the constituent analog-to-digital converters of the second set so that the multiplexer selects the compensated intermediate constituent digital output signals in the same order as the constituent analog-to-digital converters of the second set was clocked.

Example imperfections that may be estimated by the imperfection measurements include offset, gain error, 1/f-type noise, sampling time error and frequency drift. Example imperfection compensations include compensation based on the above imperfection measurements. The measurements and the compensations may be performed using any suitable known or future methods. For example, offset compensation and gain error compensation may be performed based on the methods described in WO2012/123578 A1, and sampling time error and frequency drift may be based on measurements carried out when the reference value is a varying signal. Compensation accuracy of the 1/f-type noise typically increases if the measurements are performed more often.

A second aspect is a computer program product comprising a computer readable medium, having thereon a computer program comprising program instructions. The computer program is loadable into a data-processing unit and adapted to cause execution of the method according to the first aspect when the computer program is run by the data-processing unit.

A third aspect is a time-interleaved analog-to-digital converter adapted to convert an analog input signal to a digital output signal having a sample rate R.

The time-interleaved analog-to-digital converter comprises a timing circuit adapted to generate a number M of timing signals, and an array of an integer number N of constituent analog-to-digital converters each having an analog input and a digital output.

The time-interleaved analog-to-digital converter also comprises a selector for each of the constituent analog-to-digital converters adapted to feed the analog input of each of the constituent analog-to-digital converters with either a reference value for imperfection measurements or the analog input signal for generation of an intermediate constituent digital output signal at the digital output.

Further, the time-interleaved analog-to-digital converter comprises a controller adapted to, for each of at least some activations of the array of constituent analog-to-digital converters, define a first set of an integer number K of the constituent analog-to-digital converters and a second set of an integer number L of the constituent analog-to-digital converters, wherein K+L=N, K is at least one and less than N and the first and second sets are non-overlapping.

The controller is also adapted to, for each of at least some activations of the array of constituent analog-to-digital converters, cause the selector of each of the constituent analog-to-digital converters of the first set to feed the constituent analog-to-digital converters of the first set with the reference value, cause the selector of each of the constituent analog-to-digital converters of the second set to feed the constituent analog-to-digital converters of the second set with the analog input signal, clock each of the constituent analog-to-digital converters of the first set with one of the timing signals, and clock each of the constituent analog-to-digital converters of the second set with one of the timing signals, wherein no timing signal is used to clock two or more of the constituent analog-to-digital converters of the second set.

According to some embodiments, the selector for each of the constituent analog-to-digital converters may comprise an input switch adapted to switch the analog input between the analog input signal and the reference value. In such embodiments, the controller may be adapted to cause the selector of each of the constituent analog-to-digital converters of the first set to feed the constituent analog-to-digital converters of the first set with the reference value by setting the input switch of each of the constituent analog-to-digital converters of the first set to the reference value, and may be adapted to cause the selector of each of the constituent analog-to-digital converters of the second set to feed the constituent analog-to-digital converters of the second set with the analog input signal by setting the input switch of each of the constituent analog-to-digital converters of the second set to the analog input signal.

In some embodiments, the time-interleaved analog-to-digital converter may further comprise an output switch for each of the constituent analog-to-digital converters, adapted to switch the digital output between an intermediate constituent digital output signal path and an imperfection measurements path. In such embodiments, the controller may be further adapted to, for each of at least some activations of the array of constituent analog-to-digital converters, set the output switch of each of the constituent analog-to-digital converters of the first set to the imperfection measurements path and set the output switch of each of the constituent analog-to-digital converters of the second set to the intermediate constituent digital output signal path.

According to some embodiments, the controller may be further adapted to, for each of the at least some activations of the array of constituent analog-to-digital converters, select the K constituent analog-to-digital converters of the first set among the L constituent analog-to-digital converters of the second set of a previous activation.

In some embodiments, the time-interleaved analog-to-digital converter may further comprise one or more compensation units adapted to, for each of the constituent analog-to-digital converters of the second set, compensate the intermediate constituent digital output signal based on previous imperfection measurements of the constituent analog-to-digital converter.

The time-interleaved analog-to-digital converter may, according to some embodiments, further comprise a multiplexer adapted to multiplex the compensated intermediate constituent digital output signals of the constituent analog-to-digital converters of the second set to produce the digital output signal.

A fourth aspect is an integrated circuit comprising the time-interleaved analog-to-digital converter of the third aspect, and a fifth aspect is an electronic device comprising the time-interleaved analog-to-digital converter of the third aspect or the integrated circuit of the fourth aspect.

In some embodiments, the third, fourth and fifth aspects may additionally have features identical with or corresponding to any of the various features as explained above for the first aspect.

An advantage of some embodiments is that imperfection measurements may be performed during analog-to-digital conversion of an analog input signal. This enables the time-interleaved analog-to-digital converter to follow and compensate for time-varying imperfections, e.g. a drift over time.

Another advantage of some embodiments is that the analog input signal does not need to include a known signal (e.g. a reference signal level). Thus, the imperfection measurements may be performed during analog-to-digital conversion of any analog input signal.

Another advantage of some embodiments is that all constituent analog-to-digital converters are characterized individually. This enables, for example, that variations between the constituent analog-to-digital converters may be compensated for, and the constituent analog-to-digital converters does not have to be matched.

Yet another advantage is that the imperfection measurement is dynamic and flexible. For example, the frequency and distribution of imperfection measurements may be varied. Such variation may be implemented in software, for example.

BRIEF DESCRIPTION OF THE DRAWINGS

Further objects, features and advantages will appear from the following detailed description of embodiments, with reference being made to the accompanying drawings, in which.

DETAILED DESCRIPTION

In the following, embodiments will be described where the individual processing paths (each comprising a constituent ADC in an array of constituent ADC:s) of a time-interleaved ADC is repeatedly characterized by imperfection measurements during operation. The imperfection measurements may, for example, include estimation of absolute offset, gain offset, 1/f-type noise, etc. Repeating measurements allows a compensation to follow time-varying imperfections, e.g. drifts.

According to some embodiments, imperfection measurements are performed on at least one of the processing paths during at least some of the activations of the array of constituent ADC:s. In a typical implementation, imperfection measurements are performed on precisely one of the processing paths during each activation of the constituent ADC:s. The processing path(s) appointed for imperfection measurements may vary between activations such that all processing paths are eventually and repeatedly characterized.

The imperfection measurements may be realized by letting the analog input to the constituent ADC of the processing path to be measured receive a reference signal value instead of the analog input signal during that activation of the array of constituent ADC:s. The reference value may be a ground level or a zero level (e.g. 0 V) in which case it is typically assumed that the imperfection is linear (i.e. that the imperfection is independent of the input signal value). Alternatively, the reference value may be a non-zero level. One example of how a non-zero level may be used to calibrate a constituent ADC is disclosed in WO 2012/123578 A1. Yet alternatively, the reference value may vary among a number of different reference levels (suitable for performing different types of imperfection measurements) between different measurement occasions. In some embodiments, the reference value is a varying signal, which enables measuring and compensating for sampling time imperfections and frequency drift.

The reference value may be input to the constituent ADC by operation of a switch at the input of the constituent ADC. Alternatively, the reference value may be set as input to the constituent ADC by earlier processing steps.

Figure 1:
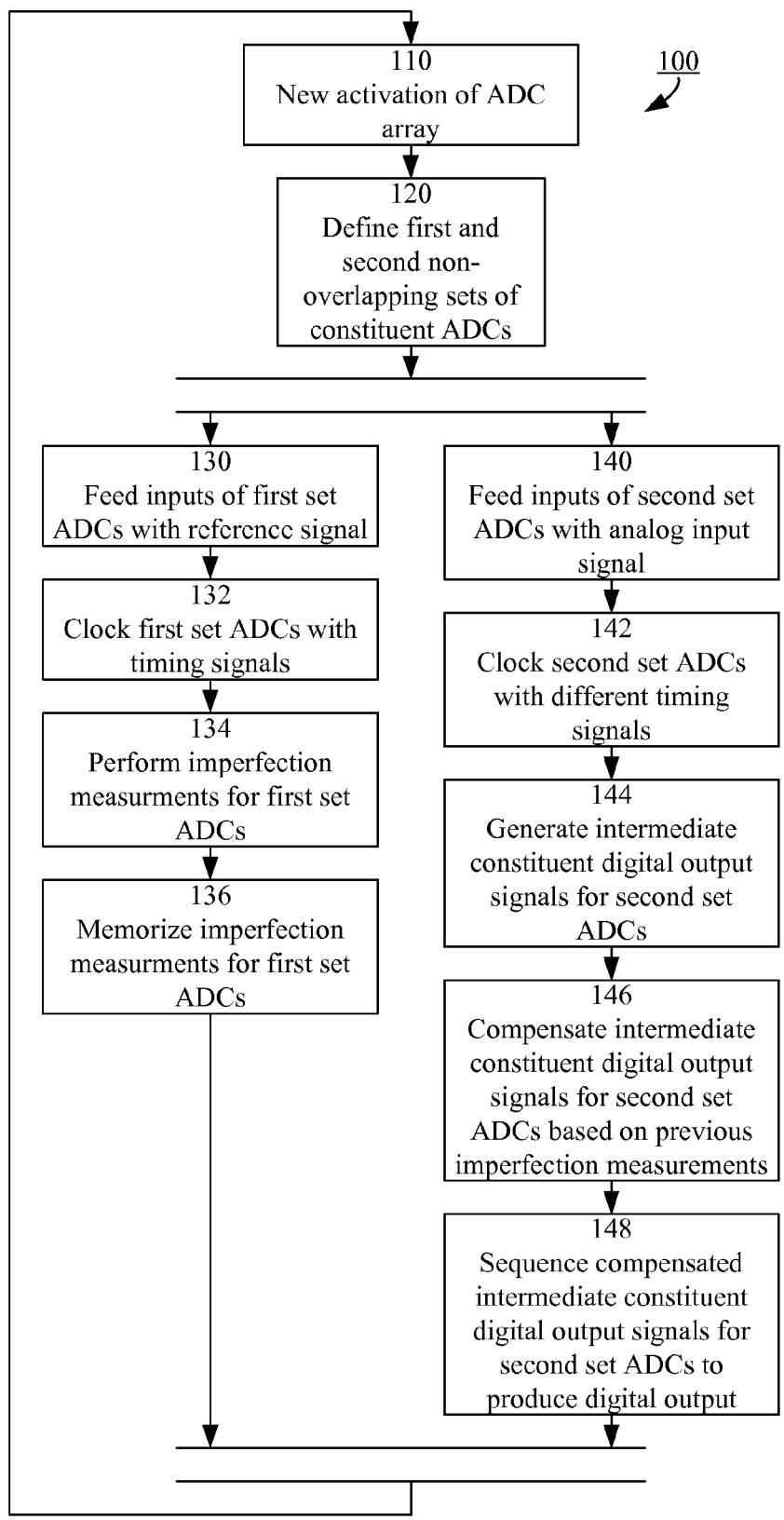
FIG. 1 is a flowchart illustrating example method steps according to some embodiments.

FIG. 1 illustrates an example method 100 according to some embodiments of operating a time-interleaved analog-to-digital converter for conversion of an analog input signal to a digital output signal having a sample rate R. The method is executed for each activation of the array of N constituent ADC:s as illustrated by step 110.

In step 120, first and second non-overlapping sets of constituent ADC:s are defined. The first set comprises K of the constituent ADC:s, the second set comprises L of the constituent ADC:s, and K+L=N. In a typical application, the K constituent ADC:s of the first set may be selected among the L constituent ADC:s of the second set of a previous activation. For example, the selection may be conditioned by that, during any N/K activations, all N constituent analog-to-digital converters of the array are to belong to the first set at least once. In a typical implementation the membership of the first set may circulate among the constituent analog-to-digital converters in a round-robin fashion or according to any other uniform distribution rule.

The operations that relate to the first set (steps 130-136) may then be performed in parallel to the operations that relate to the second set (steps 140-148) as illustrated in FIG. 1. It should be noted however, that according to some embodiments, these operations may be performed in sequence in any suitable order or in a semi-parallel fashion where some operations are performed in sequence and some in parallel.

In step 130, the inputs of the constituent ADC:s of the first set are fed with a reference signal value and when the constituent ADC:s of the first set are clocked by respective timing signals in step 132 imperfection measurements are performed (step 134). The result of the measurements is memorized for later use (see e.g. step 146) in step 136.

In step 140, the inputs of the constituent ADC:s of the second set are fed with an analog input signal and when the constituent ADC:s of the second set are clocked by respective (mutually different) timing signals in step 142 intermediate constituent digital output signals are generated from the analog input signal (step 144). The intermediate constituent digital output signals of the second set are compensated in step 146 based on previous imperfections measurements (see e.g. step 136) of the respective constituent ADC and possibly also of other constituent ADC:s of the array.

Then the compensated intermediate constituent digital output signals are sequenced (or otherwise properly multiplexed) in step 148, and the method returns to step 110 for a new activation of the array of constituent ADC:s.

The timing signals referred to is a set of M of timing signals, wherein each timing signal is a time-shifted copy of a clock signal having a clock signal period P.

Figure 2:
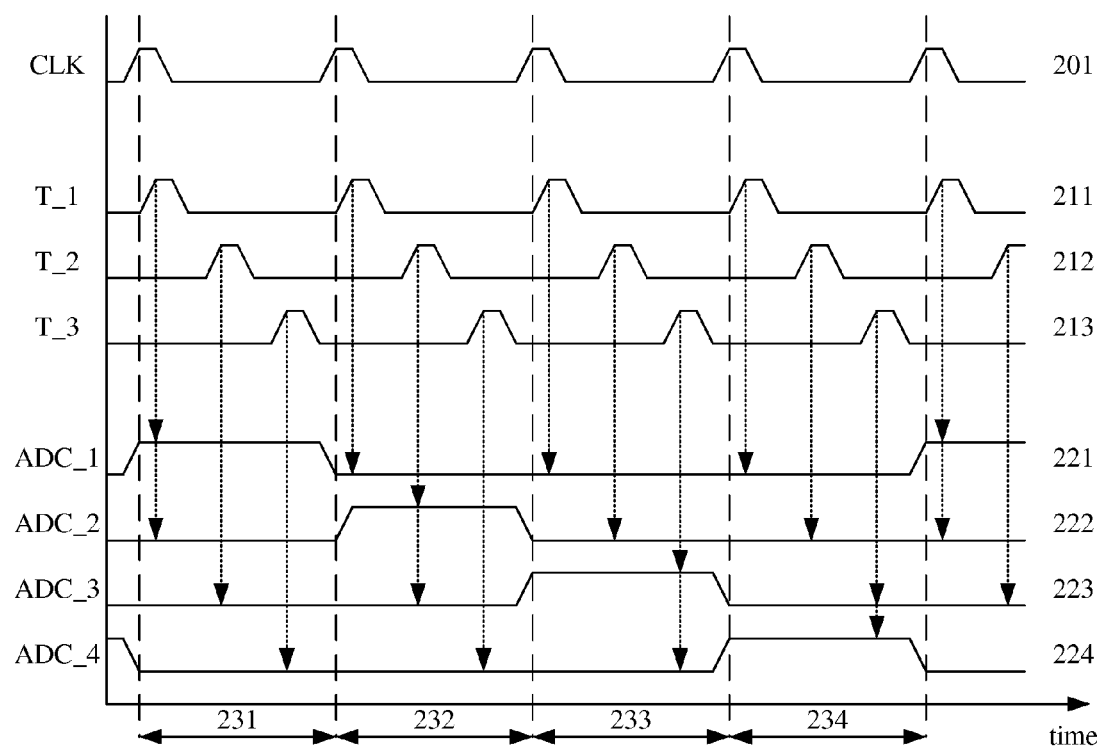
FIG. 2 is a schematic timing diagram illustrating example settings for the constituent analog-to-digital converters according to some embodiments.

FIG. 2 is a schematic timing diagram according to one example where N=4, M=L=3, and K=1. The uppermost signal 201 illustrates the clock signal (CLK) having a clock signal period P as indicated by the time periods 231, 232, 233, 234. The next M=3 signals 211, 212, 213 illustrate the timing signals (T_1, T_2, T_3) which are time-shifted copies of the clock signal. The time shift between e.g. T_1 and T_2 corresponds to the sampling period 1/R of the digital output signal.

The N=4 lowermost signals 221, 222, 223, 224 illustrate the setting of the constituent ADC:s (ADC_1, ADC_2, ADC_3, ADC_4). The processing rate of each constituent ADC corresponds to the clock signal period P and the array of constituent ADC:s is activated once per clock signal period.

In a first activation (period 231), ADC_1 is set to measurement mode (indicated only for illustrative purposes by a high signal value) and is clocked by T_1 as illustrated by the dashed arrow from signal 211 to signal 221. During the same activation, ADC_2, ADC_3 and ADC_4 are set to digitizing mode (indicated only for illustrative purposes by a low signal value). ADC_2 is clocked by T_1 as illustrated by the dashed arrow from signal 211 to signal 222, ADC_3 is clocked by T_2 as illustrated by the dashed arrow from signal 212 to signal 223 and ADC_4 is clocked by T_3 as illustrated by the dashed arrow from signal 213 to signal 224. Thus, ADC_2, ADC_3 and ADC_4 collectively produce a digitized output signal at the correct sample rate while ADC_1 is characterized.

In a second activation (period 232), ADC_2 is set to measurement mode and is clocked by T_2, while ADC_1, ADC_3 and ADC_4 are set to digitizing mode. ADC_1 is clocked by T_1, ADC_3 is clocked by T_2 and ADC_4 is clocked by T_3.

In a third activation (period 233), ADC_3 is set to measurement mode and is clocked by T_3, while ADC_1, ADC_2 and ADC_4 are set to digitizing mode. ADC_1 is clocked by T_1, ADC_2 is clocked by T_2 and ADC_4 is clocked by T_3.

In a fourth activation (period 234), ADC_4 is set to measurement mode and is clocked by T_3, while ADC_1, ADC_2 and ADC_3 are set to digitizing mode. ADC_1 is clocked by T_1, ADC_2 is clocked by T_2 and ADC_3 is clocked by T_3.

The timing diagram of FIG. 2 may be illustrative for a TI ADC implementation where one extra or redundant constituent ADC has been added to enable imperfection measurements.

Figure 3:
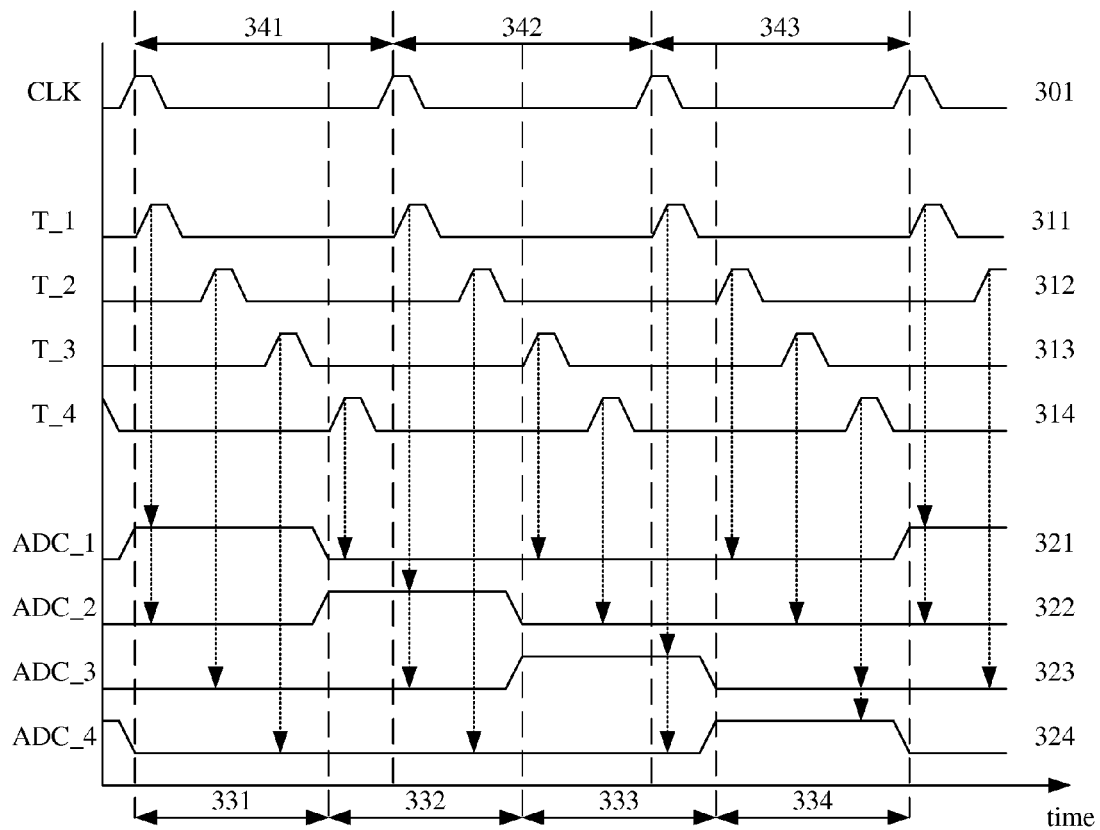
FIG. 3 is a schematic timing diagram illustrating example settings for the constituent analog-to-digital converters according to some embodiments.

FIG. 3 is a schematic timing diagram according to one example where N=M=4, L=3, and K=1. The uppermost signal 301 illustrates the clock signal (CLK) having a clock signal period P as indicated by the time periods 341, 342, 343. The next M=4 signals 311, 312, 313, 314 illustrate the timing signals (T_1, T_2, T_3, T_4) which are time-shifted copies of the clock signal. The time shift between e.g. T_1 and T_2 corresponds to the sampling period 1/R of the digital output signal.

The N=4 lowermost signals 321, 322, 323, 324 illustrate the setting of the constituent ADC:s (ADC_1, ADC_2, ADC_3, ADC_4). The processing rate of each constituent ADC is higher than the clock signal rate 1/P and the array of constituent ADC:s is activated more than once per clock signal period as illustrated by the activation periods 331, 332, 333, 334.

In a first activation (period 331), ADC_1 is set to measurement mode (indicated only for illustrative purposes by a high signal value) and is clocked by T_1 as illustrated by the dashed arrow from signal 311 to signal 321. During the same activation, ADC_2, ADC_3 and ADC_4 are set to digitizing mode (indicated only for illustrative purposes by a low signal value). ADC_2 is clocked by T_1 as illustrated by the dashed arrow from signal 311 to signal 322, ADC_3 is clocked by T_2 as illustrated by the dashed arrow from signal 312 to signal 323 and ADC_4 is clocked by T_3 as illustrated by the dashed arrow from signal 313 to signal 324.

In a second activation (period 332), ADC_2 is set to measurement mode and is clocked by T_1, while ADC_1, ADC_3 and ADC_4 are set to digitizing mode. ADC_1 is clocked by T_4, ADC_3 is clocked by T_1 and ADC_4 is clocked by T_2.

In a third activation (period 333), ADC_3 is set to measurement mode and is clocked by T_1, while ADC_1, ADC_2 and ADC_4 are set to digitizing mode. ADC_1 is clocked by T_3, ADC_2 is clocked by T_4 and ADC_4 is clocked by T_1.

In a fourth activation (period 334), ADC_4 is set to measurement mode and is clocked by T_4, while ADC_1, ADC_2 and ADC_3 are set to digitizing mode. ADC_1 is clocked by T_2, ADC_2 is clocked by T_3 and ADC_3 is clocked by T_4.

The timing diagram of FIG. 3 may be illustrative for a TI ADC implementation where no extra or redundant constituent ADC has been added, and the constituent ADC:s are clocked at a higher frequency to enable imperfection measurements (i.e. the redundancy is achieved in time domain).

Figure 4:
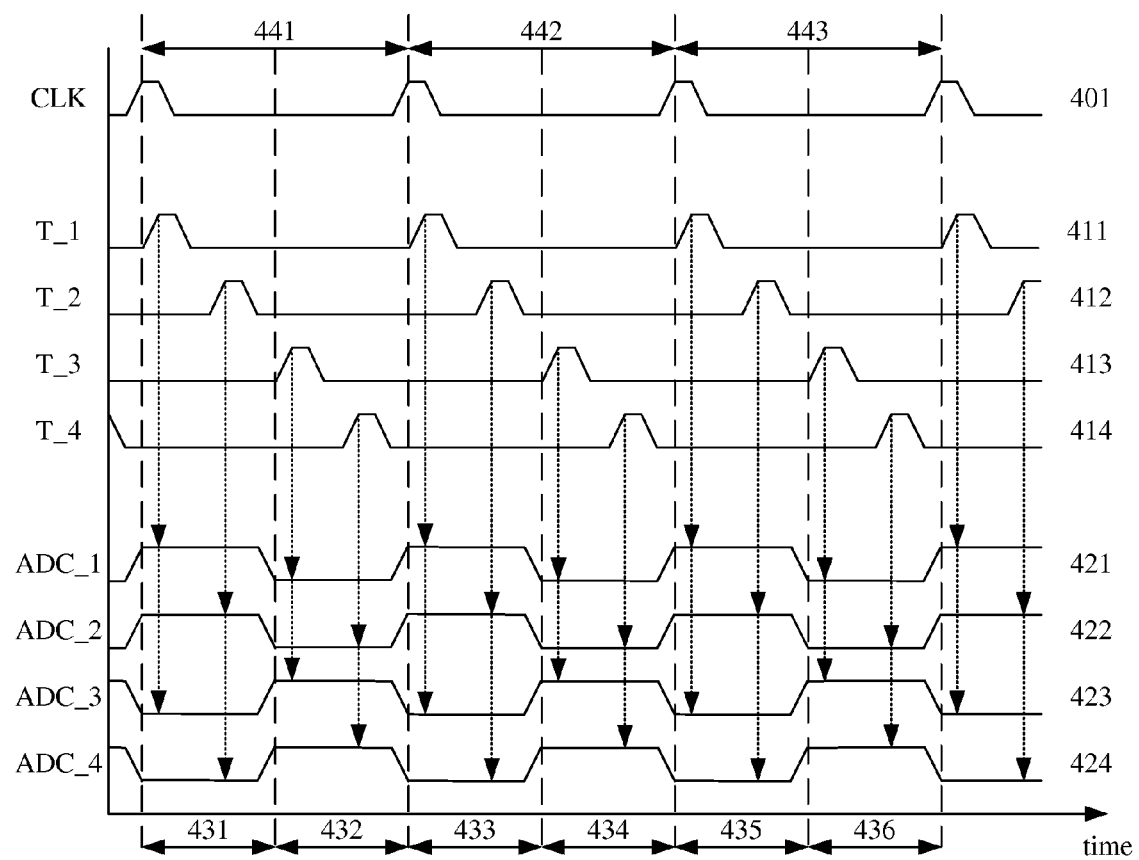
FIG. 4 is a schematic timing diagram illustrating example settings for the constituent analog-to-digital converters according to some embodiments.

FIG. 4 is a schematic timing diagram according to one example where N=M=4, L=2, and K=2. The uppermost signal 401 illustrates the clock signal (CLK) having a clock signal period P as indicated by the time periods 441, 442, 443. The next M=4 signals 411, 412, 413, 414 illustrate the timing signals (T_1, T_2, T_3, T_4) which are time-shifted copies of the clock signal. The time shift between e.g. T_1 and T_2 corresponds to the sampling period 1/R of the digital output signal.

The N=4 lowermost signals 421, 422, 423, 424 illustrate the setting of the constituent ADC:s (ADC_1, ADC_2, ADC_3, ADC_4). The processing rate of each constituent ADC is twice the clock signal rate 1/P and the array of constituent ADC:s is activated twice per clock signal period as illustrated by the activation periods 431, 432, 433, 434, 435, 436.

In a first activation (period 431), ADC_1 and ADC_2 are set to measurement mode and are clocked by T_1 and T_2 respectively, while ADC_3 and ADC_4 are set to digitizing mode and clocked by T_1 and T_2 respectively.

In a second activation (period 432), ADC_3 and ADC_4 are set to measurement mode and are clocked by T_3 and T_4 respectively, while ADC_1 and ADC_2 are set to digitizing mode and clocked by T_3 and T_4 respectively.

In a third activation (period 433), ADC_1 and ADC_2 are set to measurement mode and are clocked by T_1 and T_2 respectively, while ADC_3 and ADC_4 are set to digitizing mode and clocked by T_1 and T_2 respectively, and so on.

The timing diagram of FIG. 4 may be also illustrative for a TI ADC implementation where no extra or redundant constituent ADC has been added, and the constituent ADC:s are clocked at a higher frequency to enable imperfection measurements.

In the more general case (illustrated by the examples of FIGS. 2-4) the clock period P typically relates to the number of timing signals M and the sample rate R as PR=M, while the activation frequency 1/T of the array of constituent ADC:s relate to the sample rate R, the number of constituent ADC:s in the array (N), the first set (K) and the second set (L) as TR=L=N−K. Typically one or more parameter may be given (e.g. R, N and T) and the other may be chosen based on the above constraints.

Figure 5A:
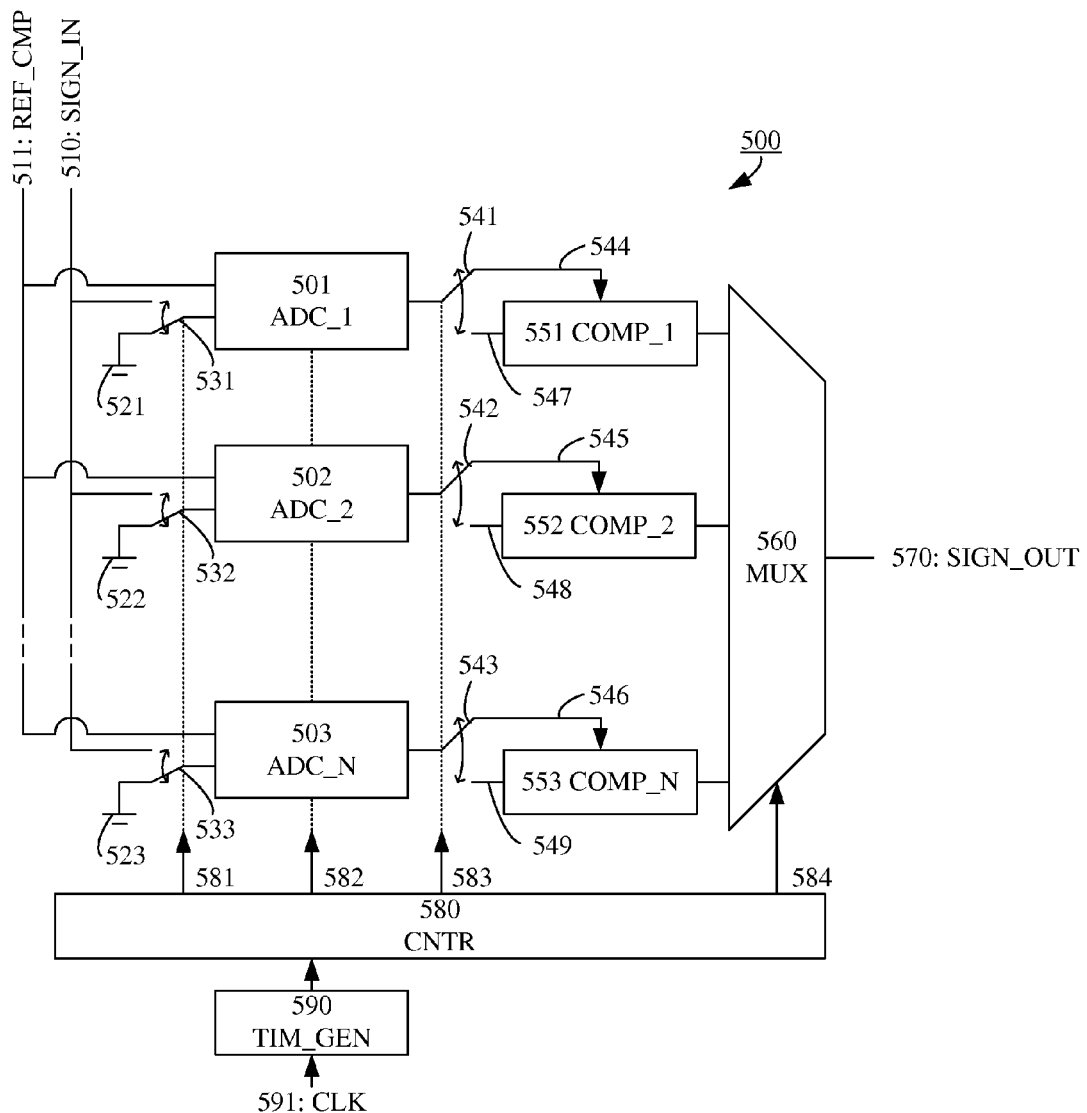
FIG. 5A is a schematic block diagram illustrating an example time-interleaved analog-to-digital converter according to some embodiments.

FIG. 5A is a schematic illustration of an example time-interleaved (TI) ADC 500 according to some embodiments. The TI ADC 500 may, for example, be adapted to perform the method as described in FIG. 1 and exemplified in FIGS. 2-4.

The TI ADC 500 comprises an array of constituent ADC:s (ADC_1, ADC_2, ..., ADC_N) 501, 502, 503. Each constituent ADC may comprise any suitable known or future ADC implementation. For example, the constituent ADC:s 501, 502, 503 may each comprise a successive approximation ADC such as any of those described in WO 2012/123578 A1 and EP 0624289 B1. A sample and hold circuit (not shown) may be implemented internally or externally to each constituent ADC.

An analog input signal (SIGN_IN) is input to the TI ADC 500 at input 510 and an input switch 531, 532, 533 at an input of each constituent ADC is switchable between the analog signal 510 and a reference signal for interference measurement (here illustrated as a ground signal level 521, 522, 523). Each constituent ADC is also fed a reference signal (REF_CMP) for comparison in the digitization process. This reference signal is input to the TI ADC at input 511.

An output switch 541, 542, 543 is provided at each of the constituent ADC outputs and is switchable between an intermediate constituent digital output signal path 547, 548, 549 and an imperfection measurements path 544, 545, 546. The intermediate constituent digital output signal path 547, 548, 549 is input to a respective compensation unit (COMP_1, COMP_2, ..., COMP_N) 551, 552, 553 which compensates the intermediate constituent digital output signal based on imperfection measurements provided earlier via the respective imperfection measurements path 544, 545, 546.

Each compensation unit may be associated with a memory or register for storing previous (and possibly also older) imperfection measurement results and/or parameters derived there from. The memory or register may be internal or external to the compensation unit and may be specific for each compensation unit or common for several or all compensation units. Each compensation unit may also be associated with calculation units for determining compensation parameters from the imperfection measurement results. The calculation unit may be internal or external to the compensation unit and may be specific for each compensation unit and/or common for several or all compensation units. There may be one compensation unit per processing path as illustrated in FIG. 5A or the compensation function may be merged in a single compensation unit for all processing paths. Furthermore, a compensation unit associated with one constituent ADC may utilize measurement results from other constituent ADC:s (e.g. in the form of average values for the array of constituent ADC:s).

A multiplexer (MUX) 560 appropriately selects and serializes outputs from the compensation units to produce a digital output signal having a sample rate R at the output (SIGN_OUT) 570 of the TI ADC 500.

The TI ADC 500 also comprises a timing circuit (TIM_GEN) 590 which generates M timing signals by time-shifting a clock signal (CLK) with period P provided at input 591. In other embodiments, the timing circuit may generate the timing signals in any other suitable (known or future) way.

The M timing signals are used by a controller (CNTR) 580 to control operation of the elements of the TI ADC 500. For each activation of the array of constituent ADC:s, the controller 580 divides the constituent ADC:s into a first set of size K and a second set of size L, where L+K=N. How this grouping into the first and second sets may be made has been elaborated on above.

By means of control signal 581 (which may comprise one control signal connection per constituent ADC), the controller sets the input switches of the first set to the reference value for imperfection measurements and sets the input switches of the second set to the analog input signal.

By means of control signal 583 (which may also comprise one control signal connection per constituent ADC), the controller sets the output switches of the first set to the imperfection measurements path and sets the output switches of the second set to the intermediate constituent digital output signal path.

The control signals 581 and 583 to the switches of each constituent ADC are typically activated once per activation of the array, and typically comprise one of two possible signal values (e.g. [0,1]) indicting which position the switch should be in (or whether or not the switch position should be changed). In some embodiments the set of control signals 581 and the set of control signals 583 are implemented as one set of control signals instead of two.

Then the controller 580 clocks each of the constituent ADC:s by forwarding the appropriate timing signals from the timing circuit 590 via control signal 582 (which may typically comprise one control signal connection per constituent ADC), wherein the selection of which timing signal may be appropriate for which constituent ADC has been elaborated on above.

By means of control signal 584, the controller 580 controls the multiplexer 560 to select the compensation unit outputs relating to the second set in an appropriate order (typically in the same order as the corresponding constituent ADC:s were clocked by control signal 582) to produce the digital output signal at the TI ADC output 570. The control signal is typically activated at the sample rate R and typically comprise one of N possible values (e.g. [1, 2, . . . , N]) indicating which compensation unit output to select.

The reference value may be input to the constituent ADC by operation of a switch at the input of the constituent ADC as illustrated in FIG. 5A. Alternatively, the reference value may be set as input to the constituent ADC by earlier processing steps as is illustrated in FIG. 5B.

Figure 5B:
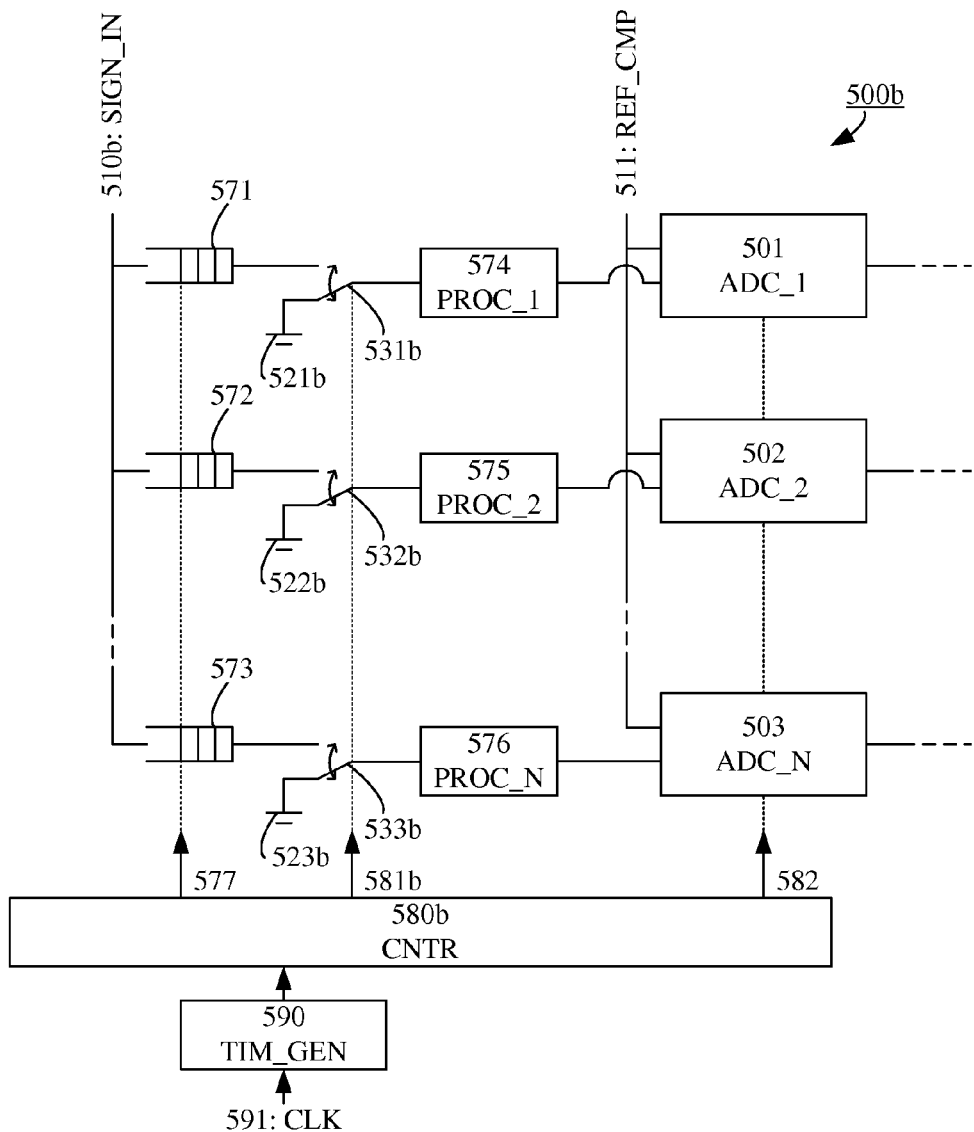
FIG. 5B is a schematic block diagram illustrating an example time-interleaved analog-to-digital converter according to some embodiments.

FIG. 5B is a schematic illustration of an example time-interleaved (TI) ADC 500*b* according to some embodiments. The TI ADC 500*b* may, for example, be adapted to perform the method as described in FIG. 1 and exemplified in FIGS. 2-4. FIG. 5B illustrate a TI ADC 500*b* where the reference value is provided earlier in the processing chain compared to the TI ADC 500 of FIG. 5A. The features of FIG. 5B that are equal or similar to the corresponding features of FIG. 5A are indicated with the same reference numbers and will not be described again in detail. In fact, some features of FIG. 5A (those subsequent to the array of constituent ADC:s) have been omitted from FIG. 5B.

The TI ADC 500*b* comprises an array of constituent ADC:s (ADC_1, ADC_2, . . . ADC_N) 501, 502, 503 and each constituent ADC is fed a reference signal (REF_CMP) for comparison in the digitization process. This reference signal is input to the TI ADC 500*b* at input 511.

An analog input signal (SIGN_IN) is input at 510*b* and buffered in N parallel buffers 571, 572, 573 (e.g. in the form of a plurality of sample and hold units appropriately clocked by a clocking signal 577).

A selection switch 531*b*, 532*b*, 533*b* at an output of each buffer is switchable between the respective buffered signal and a reference signal for interference measurement (here illustrated as a ground signal level 521*b*, 522*b*, 523*b*). Thus, at each point in time, a respective further processing step (PROC_1, PROC_2, . . . , PROC_N) 574, 575, 576 receives either a buffered analog input signal sample or a reference signal and the output of the processing steps are input to a respective constituent ADC 501, 502, 503. The processing steps 574, 575, 576 may comprise any suitable signal processing units (e.g. amplification, filtering, etc.).

The TI ADC 500*b* also comprises a timing circuit (TIM_GEN) 590 which generates M timing signals by time-shifting a clock signal (CLK) with period P provided at input 591. In other embodiments, the timing circuit may generate the timing signals in any other suitable (known or future) way.

The M timing signals are used by a controller (CNTR) 580*b* to control operation of the elements of the TI ADC 500*b*. For each activation of the array of constituent ADC:s, the controller 580*b* divides the constituent ADC:s into a first set of size K and a second set of size L, as elaborated on above.

By means of control signal 581*b* (which may comprise one control signal connection per constituent ADC), the controller sets the selection switches of the first set to the reference value for imperfection measurements and sets the selection switches of the second set to the analog input signal. The control signal 581*b* is typically activated once per activation of the array, and typically comprise one of two possible signal values (e.g. [0,1]) indicting which position the switch should be in (or whether or not the switch position should be changed).

Then the controller 580*b* clocks each of the constituent ADC:s by forwarding the appropriate timing signals from the timing circuit 590 via control signal 582 (which may typically comprise one control signal connection per constituent ADC), wherein the selection of which timing signal may be appropriate for which constituent ADC has been elaborated on above.

By means of control signal 577, the controller 580*b* controls the buffers 571, 572, 573. For example, the control signal may comprise and appropriately selected (and possibly further time-shifted) timing signal from the timing circuit 590 forwarded by the controller 580*b*.

Functional units described in FIGS. 5A and 5B (e.g. the controller 580, 580b and the timing circuit 590) may, of course, have other physical implementation according to other embodiments.

It should be noted that many implementation details that are not vital to the description of the respective embodiments may be omitted in the figures and the corresponding text. For example, when clocking of a constituent ADC is referred to only the clocking event related to commencing the processing of a new input value (e.g. an analog sample) has been explicitly mentioned, while the constituent ADC may very well receive or generate a higher frequency clocking signal (e.g. a sampling clock signal of clock period 1/R) to provide clocking of the several processing steps needed for the constituent ADC to process a single input value. Such omissions are not intended to exclude any possible presence of such features.

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus comprising circuitry/logic or performing methods according to any of the embodiments. The electronic apparatus may, for example, be an analog front-end, a communication device, a multimedia device, an audio/video recorder, etc. For example, a video processor may comprise three TI ADC:s (e.g. such as those described in FIGS. 5A and 5B), one for each channel (RGB—red, green, blue).

Figure 6:
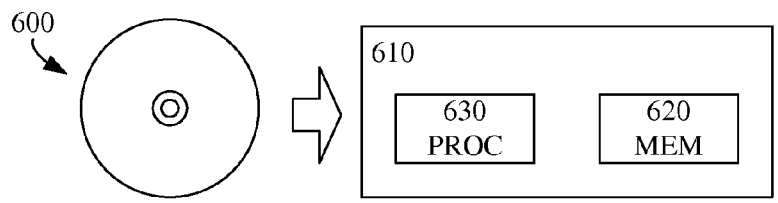
FIG. 6 is a schematic drawing illustrating a computer readable medium according to some embodiments.

According to some embodiments, a computer program product comprises a computer readable medium such as, for example, a diskette or a CD-ROM as illustrated by the CD-ROM 600 of FIG. 6. The computer readable medium may have stored thereon a computer program comprising program instructions. The computer program may be loadable into a data-processing unit 630, which may, for example, be comprised in a device 610. When loaded into the data-processing unit 630, the computer program may be stored in a memory 620 associated with or integral to the data-processing unit 630. According to some embodiments, the computer program may, when loaded into and run by the data-processing unit, cause the data-processing unit to execute method steps according to, for example, the method shown in FIG. 1.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence and vice versa.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims. For example, the controller 580 of FIG. 5A may be implemented as several units and/or the compensation units 551, 552, 553 of FIG. 5A may be implemented as a single unit.

Hence, it should be understood that the details of the described embodiments are merely for illustrative purpose and by no means limiting. Instead, all variations that fall within the range of the claims are intended to be embraced therein.

The invention claimed is:

1. A method of operating a time-interleaved analog-to-digital converter for conversion of an analog input signal to a digital output signal having a sample rate R, wherein the time-interleaved analog-to-digital converter comprises:
   a timing circuit for generating a number M of timing signals, wherein each timing signal is a time-shifted copy of a clock signal having a period P; and
   an array of an integer number N of constituent analog-to-digital converters each having an analog input and a digital output, wherein N is equal to M;
   the method comprising:
   for each of at least some activations of the array of constituent analog-to-digital converters:
      defining a first set of an integer number K of the constituent analog-to-digital converters and a second set of an integer number L of the constituent analog-to-digital converters, wherein K+L=N, K is at least one and less than N and the first and second sets are non-overlapping;
      feeding the analog input of each of the constituent analog-to-digital converters of the first set with a reference value for imperfection measurements;
      clocking each of the constituent analog-to-digital converters of the first set with one of the timing signals;
      feeding the analog input of each of the constituent analog-to-digital converters of the second set with the analog input signal for generation of an intermediate constituent digital output signal at the digital output; and
      clocking each of the constituent analog-to-digital converters of the second set with one of the timing signals, wherein no timing signal is used to clock two or more of the constituent analog-to-digital converters of the second set,
   wherein the array of constituent analog-to-digital converters is activated more than once per the period P.

2. The method of claim 1 further comprising, for each of the at least some activations of the array of constituent analog-to-digital converters, selecting the K constituent analog-to-digital converters of the first set among the L constituent analog-to-digital converters of the second set of a previous activation.

3. The method of claim 2 wherein the selection is conditioned by that, during any N/K activations, all N constituent analog-to-digital converters of the array are to belong to the first set at least once.

4. The method of claim 1 further comprising, for each of the constituent analog-to-digital converters of the second set, compensating the intermediate constituent digital output signal based on previous imperfection measurements of the constituent analog-to-digital converter.

5. The method of claim 4 further comprising multiplexing the compensated intermediate constituent digital output signals of the constituent analog-to-digital converters of the second set to produce the digital output signal.

6. A computer program product comprising a non-transitory computer readable medium, having thereon a computer program comprising program instructions, the computer program being loadable into a data-processing unit and adapted to cause execution of the method according to claim 1 when the computer program is run by the data-processing unit.

7. A time-interleaved analog-to-digital converter adapted to convert an analog input signal to a digital output signal having a sample rate R, the time-interleaved analog-to-digital converter comprising:
  a timing circuit adapted to generate a number M of timing signals, wherein each timing signal is a time-shifted copy of a clock signal having a period P;
  an array of an integer number N of constituent analog-to-digital converters each having an analog input and a digital output, wherein N is equal to M;
  a selector for each of the constituent analog-to-digital converters adapted to feed the analog input of each of the constituent analog-to-digital converters with either a reference value for imperfection measurements or the analog input signal for generation of an intermediate constituent digital output signal at the digital output; and
  a controller adapted to, for each of at least some activations of the array of constituent analog-to-digital converters:
    define a first set of an integer number K of the constituent analog-to-digital converters and a second set of an integer number L of the constituent analog-to-digital converters, wherein K+L=N, K is at least one and less than N and the first and second sets are non-overlapping;
    cause the selector of each of the constituent analog-to-digital converters of the first set to feed the constituent analog-to-digital converters of the first set with the reference value;
    cause the selector of each of the constituent analog-to-digital converters of the second set to feed the constituent analog-to-digital converters of the second set with the analog input signal;
    clock each of the constituent analog-to-digital converters of the first set with one of the timing signals; and
    clock each of the constituent analog-to-digital converters of the second set with one of the timing signals, wherein no timing signal is used to clock two or more of the constituent analog-to-digital converters of the second set,
  wherein the array of constituent analog-to-digital converters is activated more than once per the period P.

8. The time-interleaved analog-to-digital converter of claim 7 wherein:
  the selector for each of the constituent analog-to-digital converters comprises an input switch for each of the constituent analog-to-digital converters, adapted to switch the analog input between the analog input signal and the reference value;
  the controller is adapted to cause the selector of each of the constituent analog-to-digital converters of the first set to feed the constituent analog-to-digital converters of the first set with the reference value by setting the input switch of each of the constituent analog-to-digital converters of the first set to the reference value; and
  the controller is adapted to cause the selector of each of the constituent analog-to-digital converters of the second set to feed the constituent analog-to-digital converters of the second set with the analog input signal by setting the input switch of each of the constituent analog-to-digital converters of the second set to the analog input signal.

9. The time-interleaved analog-to-digital converter of claim 7 further comprising an output switch for each of the constituent analog-to-digital converters, adapted to switch the digital output between an intermediate constituent digital output signal path and an imperfection measurements path, and wherein the controller is further adapted to, for each of at least some activations of the array of constituent analog-to-digital converters, set the output switch of each of the constituent analog-to-digital converters of the first set to the imperfection measurements path and set the output switch of each of the constituent analog-to-digital converters of the second set to the intermediate constituent digital output signal path.

10. The time-interleaved analog-to-digital converter of claim 7 wherein the controller is further adapted to, for each of the at least some activations of the array of constituent analog-to-digital converters, select the K constituent analog-to-digital converters of the first set among the L constituent analog-to-digital converters of the second set of a previous activation.

11. The time-interleaved analog-to-digital converter of claim 7 further comprising one or more compensation units adapted to, for each of the constituent analog-to-digital converters of the second set, compensate the intermediate constituent digital output signal based on previous imperfection measurements of the constituent analog-to-digital converter.

12. The time-interleaved analog-to-digital converter of claim 11 further comprising a multiplexer adapted to multiplex the compensated intermediate constituent digital output signals of the constituent analog-to-digital converters of the second set to produce the digital output signal.

13. An integrated circuit comprising the time-interleaved analog-to-digital converter of claim 7.

14. An electronic device comprising the time-interleaved analog-to-digital converter of claim 7.

15. An electronic device comprising the integrated circuit of claim 13.

* * * * *